(12) United States Patent
Filhol et al.

(10) Patent No.: US 9,731,958 B2
(45) Date of Patent: Aug. 15, 2017

(54) MICROELECTROMECHANICAL SYSTEM AND FABRICATING PROCESS HAVING DECOUPLING STRUCTURE THAT INCLUDES ATTACHING ELEMENT FOR FASTENING TO CARRIER

(71) Applicant: THALES, Courbevoie (FR)

(72) Inventors: Fabien Filhol, Valence (FR); Pierre-Olivier Lefort, Valence (FR); Bertrand Leverrier, Montelier (FR); Régis Quer, Saint Peray (FR); Bernard Chaumet, Chatellerault (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/273,423

(22) Filed: Sep. 22, 2016

(65) Prior Publication Data
US 2017/0107098 A1    Apr. 20, 2017

(30) Foreign Application Priority Data
Oct. 16, 2015  (FR) ...................................... 15 02178

(51) Int. Cl.
*B81B 7/00*     (2006.01)
*B81C 3/00*     (2006.01)
(Continued)

(52) U.S. Cl.
CPC .......... *B81B 7/0016* (2013.01); *B81B 7/0051* (2013.01); *B81C 1/00269* (2013.01);
(Continued)

(58) Field of Classification Search
CPC ... B81B 7/0016; B81B 7/0048; B81B 7/0051; B81C 1/00269; B81C 1/00325;
(Continued)

(56) References Cited

U.S. PATENT DOCUMENTS 7,247,246 B2 * 7/2007 Nasiri ................. B81C 1/00238
216/2
9,409,765 B1 * 8/2016 Desai .................... B81B 7/0058
(Continued)

FOREIGN PATENT DOCUMENTS

| DE | 41 07 658 A1 | 9/1992 |
| EP | 2 447 209 A1 | 5/2012 |
| EP | 2 679 536 A2 | 1/2014 |

*Primary Examiner* — Stephen W Smoot
(74) *Attorney, Agent, or Firm* — Baker & Hostetler LLP (57) ABSTRACT

A microelectromechanical system comprising an assembly of layers stacked in a stacking direction comprises an active layer made of single-crystal silicon comprising an active structure, and first and second covers defining a cavity around the active structure, the active layer interposed between the first and second covers, the second cover comprising a single layer made of single-crystal silicon. The assembly comprises a decoupling layer made of single-crystal silicon and comprising: an attaching element fastened to a carrier, a frame encircling the attaching element in the plane of the decoupling layer, and a mechanical decoupling structure connecting the frame and the attaching structure, the mechanical decoupling structure allowing the attaching element to be flexibly joined to the frame. The frame is secured to the silicon layer of the second cover and at most one film of silicon dioxide is interposed between the frame and silicon layer of the second cover.

15 Claims, 4 Drawing Sheets

(51) Int. Cl.
*B81C 1/00* (2006.01)
*H01L 23/10* (2006.01)

(52) U.S. Cl.
CPC .............. *B81C 3/001* (2013.01); *H01L 23/10* (2013.01); *B81C 2201/019* (2013.01)

(58) Field of Classification Search
CPC ................ B81C 1/00365; B81C 3/001; B81C 2201/019; H01L 23/10; H01L 23/147; H01L 24/27; H01L 24/32; H01L 24/83; H01L 24/93
See application file for complete search history.

(56) References Cited

U.S. PATENT DOCUMENTS

| | | | |
|---|---|---|---|
| 2006/0237810 A1* | 10/2006 | Sand | B81C 1/00269 257/434 |
| 2012/0142144 A1* | 6/2012 | Taheri | B81B 7/007 438/107 |
| 2012/0299129 A1* | 11/2012 | Arunasalam | B81B 3/001 257/415 |
| 2014/0374847 A1* | 12/2014 | Hrovat | B81B 3/0016 257/415 |
| 2015/0181697 A1 | 6/2015 | Goida et al. | |
| 2015/0353345 A1* | 12/2015 | Heuck | B81B 7/0016 257/418 |

* cited by examiner

MICROELECTROMECHANICAL SYSTEM AND FABRICATING PROCESS HAVING DECOUPLING STRUCTURE THAT INCLUDES ATTACHING ELEMENT FOR FASTENING TO CARRIER

CROSS-REFERENCE TO RELATED APPLICATION

This application claims priority to foreign French patent application No. FR 1502178, filed on Oct. 16, 2015, the disclosure of which is incorporated by reference in its entirety.

FIELD OF THE INVENTION

The present invention relates to microelectromechanical systems (MEMS) such as microsensors or microactuators. The invention relates to micro-machined microsystems of the type made of silicon (i.e. comprising an active mechanical structure produced in a single-crystal silicon layer). The active structure is essentially planar in the wafer in which it is etched. The fabrication of these micro-machined microelectromechanical systems uses wafer-scale micro-machining techniques (doping, deposition, etching, etc.) that are similar to those used to fabricate electronic integrated circuits, enabling low production costs. The invention more particularly relates to microsensors, allowing a physical quantity such as an angular velocity (gyrometer), an angular movement (gyroscope), an acceleration (accelerometer), or a pressure (pressure sensor) to be measured. By sensitive structure of a MEMS sensor, what is meant is a deformable portion of the MEMS, the deformation of which varies under the effect of a physical quantity (acceleration, angular velocity, pressure) that is the physical quantity to be measured. The active structure may also deform under the effect of an electric signal, when it includes micro-actuators. The active structure typically has dimensions ranging from a few microns to a few millimeters.

BACKGROUND

According to one frequent method of implementation, the sensitive structure of a MEMS sensor is made to vibrate so as to observe the effect of the physical quantity to be measured on the vibration amplitude or resonant frequency. In general, the performance of such a sensor depends on the quality factor of the one or more useful vibration modes of the sensitive structure. Single-crystal materials such as quartz or silicon allow micro-resonators with high quality factors to be fabricated.

Their packaging comprises means that allow these MEMSs to be handled during the integration into products without risking degradation thereof and limiting the impact of the external environment on their sensitive structures—in particular to protect them from dust.

To obtain a high quality factor, it is furthermore necessary to place the active structure under a relatively high vacuum. It is therefore encapsulated in a seal-tight enclosure, which may be integrated into the MEMS chip or may be formed by a housing to which the MEMS chip is attached, and within which a low-pressure atmosphere is created. Frequently a pressure lower than $10^{-2}$ hPa is necessary for correct operation. The technologies used to attach the MEMS to its housing must therefore be compatible with the generation of a vacuum, meaning that materials liable to degas are to be avoided.

The packaging must also ensure that the relative position of the sensitive structure on its carrier is controllable. It is known to use adhesive bonding or soldering technologies to fasten MEMS to a carrier. An adhesive bond or solder joint is produced on all or part of one side of the structure using what are called flexible silicone-based adhesives or what are called stiff solder joints, which are based on a mixture of tin and gold.

Figure 1:
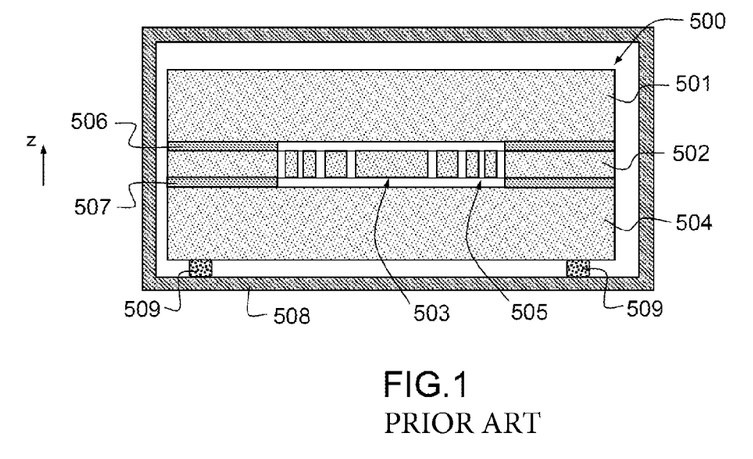
FIG. 1, which has already been described, shows a prior-art microelectromechanical system in cross section, the cross section shown being in a plane parallel to the stacking direction of the constituent layers of the microsystem.

FIG. 1 illustrates a first architecture of an electromechanical device comprising a MEMS chip 500 fastened to a carrier 508. The MEMS chip comprises a stack, produced in a stacking direction z, of a plurality of silicon layers comprising: a single-crystal silicon substrate 501, a cover 504 made of single-crystal silicon, a sensitive layer 502 made of single-crystal silicon and interposed between the cover 504 and the substrate 501, said sensitive layer 502 comprising a deformable sensitive structure 503. The cover 504 and the substrate 501 define a cavity 505 around the active structure 503.

The single-crystal silicon layers 501, 502, 504 are connected pairwise by silicon-oxide layers 506, 507. The MEMS chip 500 is fastened to a carrier 508, here a housing, by means of adhesive or solder bumps 509.

One of the constraints which may affect the performance of MEMS sensors, and that is of particular interest in the present invention, is the need to limit the transmission of slowly varying thermomechanical stresses to the sensitive structure. These thermomechanical stresses are transmitted, to the sensitive structure 503, via the fastening elements 509 of the sensor. These stresses typically originate from:

deformations in the plane perpendicular to the stacking direction z, which deformations are caused by the effect of differential thermal expansion between the material of the MEMS sensor 500 and the material of the carrier 508;

deformations of the carrier 508 out of this plane, for example due to the carrier 508 being fastened to another element;

creep in the material employed to fasten the MEMS sensor to its carrier, i.e. in the fastening bumps, this creep causing a slow variation in the stresses.

Some of these deformations are transmitted to the sensitive structure of the MEMS sensor and cause the output signal of the sensor to drift. It is possible to model and to compensate for some of this drift, in particular the drift due to temperature variations. In contrast, it is not possible to compensate for the drift due to creep. The design of high-performance microsensors requires the architecture of the attachment of the MEMS sensor to be optimized so as to decrease as much as possible the transmission of thermomechanical stresses to the sensitive element, i.e. so as to decouple the static deformation of the carrier and the static deformation of the sensitive structure.

This may in particular be achieved using flexible fastening elements, for example silicone-based adhesives, allowing the carrier to be fastened to the MEMS sensor, and which deform to absorb the deformations of the carrier. However, the adhesive bonding or soldering area must be large enough to ensure the robustness of the joint in the operating environment (vibrations, shocks, thermal cycles). As a result, it is difficult to completely suppress the stresses caused by the difference between the thermal expansion coefficients of the silicon of the MEMS chip and of the adhesive/solder. In addition, the performance of the sensor may be sensitive to geometric defects in the adhesive/solder bump.

It is also known to use soldering technologies with various alloys (for example a mixture of tin and gold) or rigid adhesive bonding technologies applied to areas of the MEMS sensor with various sizes to fasten the MEMS sensor to its carrier. However, since these alloys are much stiffer than a flexible adhesive, they are liable to strongly transmit thermomechanical stresses to the sensitive element.

To mitigate the aforementioned drawbacks, it is known that flexible decoupling structures may be added to form an interface between the fastening elements (or fastening bumps) and the MEMS sensor.

Figure 2:
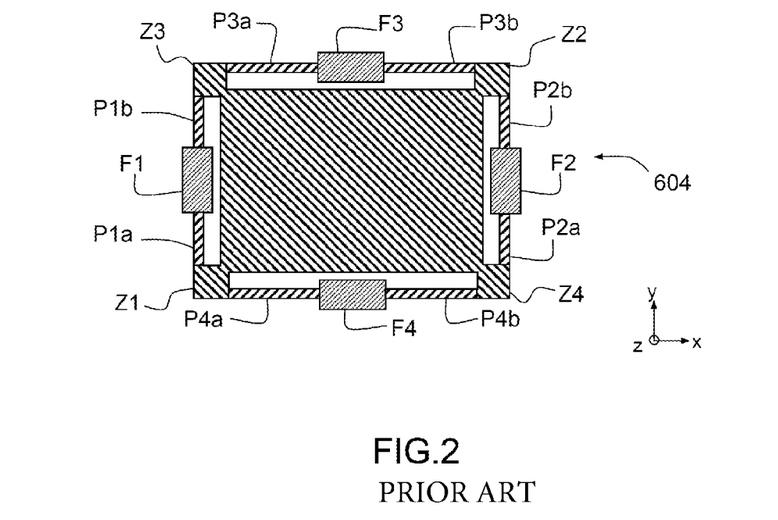
FIG. 2, which has already been described, schematically shows in cross section a decoupling layer of a prior-art microsystem.

FIG. 2 illustrates a decoupling layer of a second exemplary microsystem according to the prior art. This microsystem is described in the patent application published under the reference EP2447209. It differs from that in FIG. 1 by its cover 604, which is the only element visible in FIG. 2. FIG. 2 schematically shows the cover 604 in cross section. The cover 604 comprises elements F1, F2, F3, F4 via which the MEMS chip is fastened to the carrier 508. The device therefore comprises 4 fastening bumps interposed between the respective fastening elements F1 to F4 and the carrier 508. The fastening elements F1, F2, F3, F4 are joined to those zones of the active layer Z1 to Z4 which are secured to the sensitive layer 502 via flexible decoupling structures that are flexible beams (P1a, P1b, P2a, P2b, P3a, P3b, P4a and P4b) extending in two directions orthogonal to the x,y plane perpendicular to the stacking direction z. The role of the flexible decoupling structures is to filter the static deformations of the carrier in order to minimize the transmission of mechanical stresses from the carrier 508 to the sensitive structure 503.

This solution makes it possible to improve the performance of the static decoupling of thermomechanical stresses between the active structure of the MEMS sensor and its carrier. In contrast, this solution remains limited by the fact that the fastening structure is hyperstatic, i.e. there are more fastening points than is strictly necessary to suppress all the degrees of freedom. Despite the static decoupling provided by the decoupling beams, some of the deformation of the carrier will still be transmitted to the active structure.

SUMMARY OF THE INVENTION

One aim of the invention is to design a microelectromechanical system that is able to be fastened to a carrier with a limited transmission of mechanical stresses from the carrier to the active structure of the MEMS chip.

To this end, one subject of the invention is a microelectromechanical system comprising an assembly of a plurality of layers stacked in a stacking direction comprising:

an active layer made of single-crystal silicon, said active layer comprising an active structure, and a first cover and a second cover defining a cavity around the active structure, the active layer being interposed between the first cover and the second cover, the second cover comprising a single layer made of single-crystal silicon.

The assembly furthermore comprises a decoupling layer made of single-crystal silicon and comprising:

an attaching element intended to be fastened to a carrier, a frame encircling the attaching element in the plane of the decoupling layer, and a mechanical decoupling structure connecting the frame and the attaching structure, the mechanical decoupling structure allowing the attaching element to be flexibly joined to the frame.

The frame is secured to the silicon layer of the second cover and at most one film of a material is interposed between said frame and said silicon layer of the second cover. The material is silicon dioxide.

The microelectromechanical system thus formed is a MEMS chip. One single attaching element of the MEMS chip is intended to be fastened to a carrier. The decoupling structures allow the transmission of stresses associated with deformation of the carrier to the MEMS chip and in particular to the sensitive structure of the MEMS chip to be limited. Specifically, it is possible to form an isostatic joint between the MEMS chip and its carrier.

The attaching element occupies a central position, in a plane perpendicular to the stacking direction, since it is encircled by a frame. The attaching element is joined to the frame, and therefore to the rest of the MEMS chip, by the flexible decoupling structures. This architecture makes it possible to limit the effects of vibrations on the sensitive structure because the structure retains a certain degree of balance. In addition, producing the decoupling structures at the centre, rather than on the periphery, leads to a saving in silicon area, thereby also procuring an advantage in terms of recurrent fabrication costs, because it is possible to fabricate a larger number of MEMS chips per wafer.

Producing a decoupling structure involves etching a silicon layer and freeing the structure formed, this having the effect of letting ambient atmosphere pass through the layer in which the decoupling structure is produced. Because the attaching element and the decoupling structure are formed in an additional dedicated silicon layer that is different from the silicon layers of the covers, it is possible to avoid compromising the encapsulation of the active structure in the cavity formed around this sensitive structure. This makes it possible to avoid breaking the vacuum integrated into the cavity formed around the sensitive structure or to prevent the active structure from being exposed to dust while nonetheless allowing the mechanical decoupler to be placed facing the sensitive structures of the MEMS chip (i.e. while allowing decoupling structures to be provided that occupy the same coordinates as the sensitive structures of the MEMS chip in a plane perpendicular to the stacking direction). Now, placing the decoupling structure facing the sensitive structures of the MEMS chip makes it possible to guarantee the structure has a certain balance, allowing the effect of vibrations on the active structure to be limited and the general symmetry of the structure of the sensor to be preserved, thereby ensuring a certain degree of symmetry in the physical effects affecting the active structure. This is particularly important in the case where the sensitive structure possesses symmetry elements resulting from a differential architecture. The MEMS chip is thus compatible with a vacuum produced in the housing and a vacuum integrated into the MEMS chip and does not suffer from exposure to dust or a degradation of the vacuum.

The invention is compatible with various soldering and rigid or flexible adhesive bonding solutions, thereby giving the designer a certain degree of freedom to adjust the dynamic decoupling depending on the architecture of the active structure and the targeted operating environment. By dynamic decoupling, what is meant is the separation of the frequencies of the vibrational eigenmodes of the MEMS chip attached to its carrier and the frequencies of the useful modes of the active structure.

As the decoupling structures are produced directly in the silicon of the MEMS chip, the homogeneity and the compactness of the chip are preserved and wafer-scale fabrication of a plurality of chips according to the invention is possible. Moreover, the micro-machining processes available for producing the active structure and the decoupling structure, and the processes for assembling the silicon cover with the decoupling layer, allow their geometries to be well controlled and these structures to be placed in precise relative positions.

This makes it possible to minimize the induced thermal stresses, by virtue of the homogeneity of the materials around the interfaces and by the absence of filler materials other than silicon dioxide.

The microsystem according to the invention advantageously comprises at least one of the following features, implemented individually or in combination:

the decoupling layer and the second cover are assembled by direct bonding;

the shape of the active structure, in a plane perpendicular to the stacking direction, has at least one symmetry element and the mechanical decoupling structure has said at least one symmetry element;

the attaching element and the decoupling structure have planes of symmetry parallel to the stacking direction, these planes of symmetry intersecting along a straight line that is parallel to the stacking direction and on which is located the centre of gravity of that portion of the microelectromechanical system which is connected to the attaching element by the decoupling structure;

the mechanical decoupling structure comprises:
at least one first decoupling element designed to permit a movement of the attaching element with respect to the frame in a first direction of the plane of the decoupling layer but to prevent any significant movement of the attaching element with respect to the frame in a second direction of the plane of the decoupling layer perpendicular to the first direction, and
at least one second decoupling element designed to permit a movement of the attaching element with respect to the frame in a third direction of the plane of the decoupling layer but to prevent any significant movement of the attaching element with respect to the frame in a fourth direction of the plane of the decoupling layer perpendicular to the third direction, the third direction being distinct from the first direction;

the first direction and the third direction are orthogonal;

the mechanical decoupling structure comprises two first decoupling elements, which are placed on either side of the attaching element in the first direction, and two second decoupling elements, which are placed on either side of the attaching element in the third direction;

the first and second decoupling elements are flexure arms;

the central attaching element is bounded by a polygon having a plurality of sides, the decoupling structure comprising joining elements joining the frame and the respective sides of the polygon, each joining element comprising at least one of said joining arms extending parallel to said side of the polygon;

the polygon has more than four sides.

The invention also relates to an electromechanical device comprising the microelectromechanical system according to the invention and a carrier, the decoupling layer being fastened to said carrier only via said attaching element.

Advantageously, a single continuous surface of the attaching element is fastened to said carrier.

The invention also relates to a process for fabricating a microelectromechanical system according to the invention, said process comprising a step of forming the assembly comprising a stacking and assembling step in which the decoupling layer and the silicon layer of the second cover are stacked and assembled so that at most one film of a material is interposed between the decoupling layer and said silicon layer of the second cover, the material being silicon dioxide.

Advantageously, the decoupling layer and the silicon layer of the second cover are assembled by direct bonding.

Advantageously, the process comprises a step of forming the assembly of the plurality of layers on the wafer scale, allowing an assembly taking the form of a wafer integrating a plurality of microelectromechanical systems to be obtained, and a separating step consisting in dicing the wafer so as to singulate the microelectromechanical systems.

BRIEF DESCRIPTION OF THE DRAWINGS

Other features and advantages of the invention will become apparent on reading the following detailed description, which is given by way of nonlimiting example and with reference to the appended drawings, in which.

From one figure to the next, the same elements are referenced by the same references.

DETAILED DESCRIPTION

Figure 3:
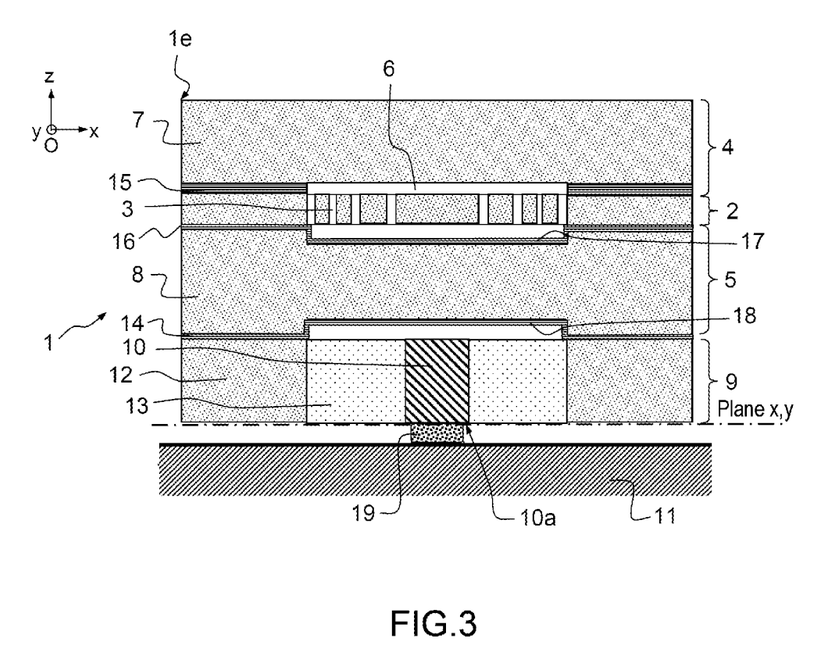
FIG. 3 schematically shows a microelectromechanical system according to the invention in cross section, in a plane parallel to the stacking direction.

FIG. 3 schematically shows a cross-sectional view of a microelectromechanical system or MEMS chip according to the invention. The cross section is produced in a plane comprising the stacking direction z.

The microsystem according to the invention is for example a sensor.

As may be seen in FIG. 3, the microelectromechanical system 1 or MEMS chip according to the invention comprises an assembly 1e of a plurality of layers stacked in the stacking direction z. The plurality of layers comprises:

a single-crystal silicon active layer 2, said active layer 2 comprising an active structure 3 of the microelectromechanical system 1, and a first cover 4 and a second cover 5 defining a cavity 6 around the active structure 3.

The active structure 3 is micro-machined in the plane of the silicon layer 2. The active structure is a structure that is able to move, i.e. able to deform freely, with respect to the rest of the active layer 2 and more particularly with respect to one or more fixed anchoring zones of the active layer 2.

The active layer 2 is interposed, in the direction z, between the first cover 4 and the second cover 5. The covers 4 and 5 have the function of supporting the sensitive (or active) layer of the MEMS chip and of protecting the sensitive structure 3 from dust and shocks.

The first cover 4 and the second cover 5 each comprise a single single-crystal silicon layer 7, 8. In the nonlimiting embodiment in FIG. 3, the silicon layer 7 of the first cover 2 is not oxidized facing the sensitive structure 3 whereas the silicon layer 8 of the second cover 5 is oxidized facing the sensitive structure 3. Generally, each cover 4, 5 consists of a single-crystal silicon layer that is oxidized, at least facing the sensitive structure, or of a layer of silicon that is pure facing the sensitive structure 3, i.e. not oxidized facing the sensitive structure 3. In the nonlimiting embodiment in FIG. 3, a silicon dioxide layer 15, 16 is interposed between each cover 4, 5 and the active layer 2 at the assembly interfaces between each cover and the active layer 2.

The stack according to the invention furthermore comprises a decoupling layer 9 made of single-crystal silicon comprising an attaching element 10 intended to be fastened to a carrier 11. The stack is fastened to the carrier 11 via the decoupling layer 9 only. In the embodiment in FIG. 3, the decoupling layer 9 is fastened to the carrier 11 only via the attaching element 10. In other words, only the attaching element 10 of the decoupling layer 9 is fastened to the carrier 11.

In the preferred embodiment in FIG. 3, the stack is fastened to the carrier 11 via a single continuous zone of that surface 10a of the attaching element 10 which is opposite the second cover 5. In the nonlimiting embodiment in FIG. 3, the stack is fastened by means of a single adhesive or solder bump 19 joining the attaching element 10 to the carrier 11. This embodiment is easy to control. In one variant, a plurality of separate zones of the attaching element 10 are fastened to the carrier 11. For example, a plurality of adhesive or solder bumps are then used. Any other fastening method allowing the stack to be fastened to the carrier 11, only via the attaching element 10, may be used.

The carrier 11 may be the bottom of a housing for example allowing the MEMS chip to be encapsulated under vacuum. The carrier may as a variant be an electronic board.

According to the invention, the decoupling layer 9 comprises a set of structures comprising the attaching element 10 and a frame 12 encircling the attaching element 10 in a plane of the decoupling layer perpendicular to the stacking direction oz. The plane of the decoupling layer is perpendicular to the plane of FIG. 3, i.e. an xy plane. The frame 12 preferably completely encircles the attaching element 10. The frame 12 has an overall rectangular shape but any other shape is possible. The attaching element 10 has a block shape in the xy plane of the decoupling layer. In other words, the attaching structure 10 takes, in the xy plane of the decoupling layer, the form of a monolithic island. Therefore, the decoupling layer 9 comprises a single surface 10a via which it is intended to be attached to a carrier 11.

The set of structures comprises a mechanical decoupling structure 13 joining the frame 12 to the attaching element 10. The decoupling structure 13 is not shown in detail in FIG. 3, it is represented by a zone filled with spaced-apart dots. It is placed around the attaching element 10. The decoupling structure 13 is configured so as to flexibly attach the attaching element 10 to the frame 12 in the xy plane of the decoupling layer 9. Therefore, the decoupling structure 13 prevents the transmission of static deformations from the carrier 11 in the xy plane to the active structure 3. These deformations in the plane are transmitted to the attaching element 10, then absorbed by the decoupling structure 13. The decoupling layer 13 according to the invention therefore makes it possible to ensure differential deformations of the carrier and attaching element 10 under the effect of temperature variations are absorbed while allowing the MEMS chip to be rigidly fastened to a carrier 11 via the attaching element 10.

The frame 12 is secured to the silicon layer 8 of the second cover 5. The covers 4, 5 and the frame 12 form fixed anchoring zones that are secured to one another. According to the invention, the frame 12 is directly fastened to the silicon layer 8 of the second cover 5. By directly fastened, what is meant is that the frame 12 is separated from the silicon layer 8 at most by a film 14 of a material, the material being silicon dioxide.

Advantageously, the decoupling layer 9 is fastened to the silicon layer 8 only via the frame 12.

The silicon layer 8 to which the frame 12 is fastened is that silicon layer of the stack which is adjacent to the decoupling layer 9 in the direction z. In other words, the silicon layer 8 of the second cover 5 is interposed between the decoupling layer 9 and the active layer 2, in the stacking direction oz over all of its area.

Typically, the silicon layers have a thickness comprised between 1 micron and 1 mm.

If, as is the case in FIG. 2, a film 14 of silicon dioxide is interposed between the silicon layer 8 and the frame 12, this film has a small thickness with respect to that of the decoupling layer 9 and of the silicon layer 8 of the second cover 5. Typically, the silicon-dioxide film 14 has a thickness comprised between 10 nanometers and 2 microns. It advantageously has a thickness at least 10 times smaller than the thickness of the decoupling layer.

Because at most one film 14 of silicon oxide is interposed between the single-crystal silicon frame 12 and the single-crystal silicon layer 8 of the second cover 5, the transmission of the stresses associated with differential thermal deformations of the second cover and decoupling layer is limited, i.e. the effect of temperature variations on the performance of the MEMS chip is limited. Specifically, either the single-crystal silicon layers are bonded together, in which case the difference in the thermal expansion coefficient of these layers is zero, or they are separated only by a silicon-oxide layer the thermal expansion coefficient of which is similar to that of silicon. It has been experimentally demonstrated that this type of stack, associating single-crystal silicon and silicon oxide, gives very good results in terms of temperature stability and stability over time.

The decoupling layer 9 fastened in this way to the silicon layer 8 of the second cover 5 forms part of the MEMS chip. The chip can be assembled in a cleanroom and the single attaching step, which is a step that is critical to the performance of the MEMS chip, is a single and final step of attaching the MEMS chip to the carrier by adhesive bonding or soldering. This makes it possible to limit the impact of this critical step on the performance of the MEMS chip and to facilitate its development and control. Specifically, the fact that the decoupling layer is fastened to the silicon layer of the second cover without any filler material other than silicon dioxide makes it possible to prevent the bake, in the step of attaching the MEMS chip to the carrier, from having an influence on the joint between the decoupling layer 9 and the second cover 5. This also makes it possible to easily control the robustness of the joint between these layers in the operating environment (vibrations, shocks, thermal cycles) and the alignment of the active structure and especially of the sensitive axis of the MEMS with the carrier and with the decoupling structure 9 in the case of an inertial sensor. Moreover, the step of fastening the decoupling layer 9 to the second cover 5 may be carried out simply and rapidly on the wafer scale and for a plurality of MEMS chips by direct or anodic bonding.

Another advantage of the invention is that for all the chips of a wafer, the MEMS chip with its decoupling layer 9 may be fabricated by a wafer-scale process before separating the chips. This procures an advantage in terms of recurrent fabrication cost.

In one preferred embodiment of the invention, the decoupling layer and the silicon layer 8 are assembled by direct bonding (also referred to as silicon direct bonding (SDB) or molecular bonding).

In this type of bonding, a high temperature and pressure are simply applied to the two silicon wafers in order to create covalent bonds at the bonding interface. This type of bonding may be of the hydrophilic type, i.e. between two hydrophilic surfaces. In this case, the bond is produced between two oxidized silicon layers 8, 12, i.e. with a surface $SiO_2$ film. As a variant, the hydrophilic bond is produced between an oxidized silicon surface and another unoxidized, i.e. pure, silicon surface. In both these cases, an $SiO_2$ film is thus present between these two layers in the final MEMS chip. The thickness of the $SiO_2$ film is smaller than or equal to a few microns. The direct bonding may also be hydrophobic, i.e. implemented between two hydrophobic surfaces. In this case, the two silicon layers brought into contact are pure, i.e. devoid of a surface $SiO_2$ film. In the MEMS chip, these layers are not separated by an $SiO_2$ film; they are bonded one to the other.

Direct bonding makes it possible to limit the generation of thermomechanical stresses at the interface between the two assembled silicon layers because it requires no interface material other than silicon dioxide. The effect of the silicon dioxide obtained by oxidation is negligible because it has a thermal expansion coefficient similar to that of silicon and it may be produced very thin with respect to the silicon layers. The silicon dioxide typically has a thickness smaller than or equal to one tenth of the thickness of the silicon layers. However, this is not limiting.

In one variant, the two silicon layers are assembled by anodic bonding. This type of assembly requires a glass layer containing sodium ions or a silicon-dioxide layer rich in sodium ions to be interposed between the two silicon layers to be assembled. A silicon-oxide layer separates the two silicon layers in the assembly. This layer differs from the silicon-oxide layer obtained by direct hydrophilic bonding as it is polluted with sodium ions. It is therefore possible to distinguish an assembly obtained by direct bonding or by anodic bonding. Transmission electron microscopy (TEM) on a micro-section allows the stack of layers, their thicknesses, their morphologies and the interfaces to be observed. The XPS (x-ray photoelectron spectroscopy) technique may be used to detect the presence of sodium ions in the oxide layer at the interface between the two assembled silicon layers.

Anodic bonding may create stresses at the interface, which are associated with the physico-chemical changes that take place in the glass during the bonding and with the difference in the thermal expansion coefficients of glass and silicon.

The active and decoupling structures are suspended structures, i.e. they are deformable in the Oxy plane.

In the embodiment in FIG. 3, the second cover 5 comprises two recesses 17, 18, formed in the silicon layer 8 of said second cover 5. A first recess 17 is located facing the active structure 3 and a second recess 18 is facing the decoupling structure 13. These recesses make it possible to guarantee that there is a space between the decoupling structure and the second cover and between the active structure and the second cover so that said structures are suspended. The thickness of the silicon-oxide layer 16 interposed between the active layer 2 and the silicon layer 7 of the first cover 5 is chosen so as to obtain a suspended active structure between the active layer and the silicon layer of the first cover. Generally, the covers comprise recesses facing the active structure and/or the decoupling structure and/or a silicon-dioxide layer is interposed between the frame and the adjacent covers and/or a silicon layer of at least one cover and the active layer at the bonding interface between this cover and the active layer so as to allow the active structure and/or the decoupling structure to deform freely.

Figure 4:
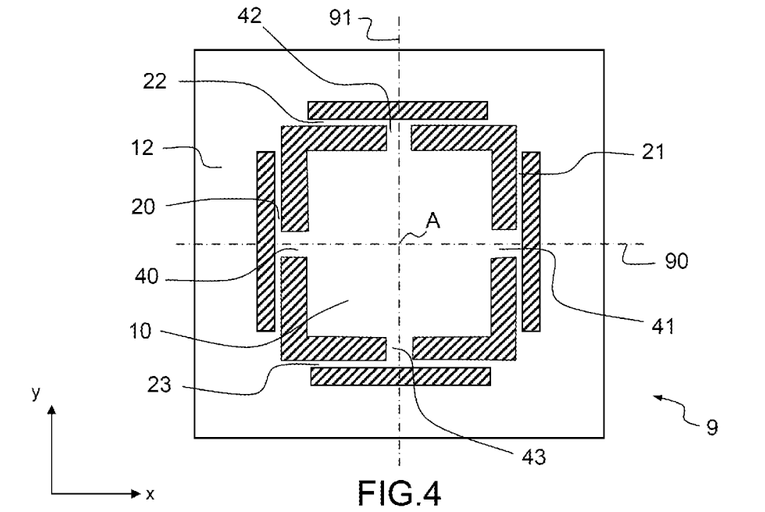
FIGS. 4 and 5 schematically show in cross section, in planes perpendicular to the stacking direction, three exemplary decoupling layers according to the invention.
Figure 5:
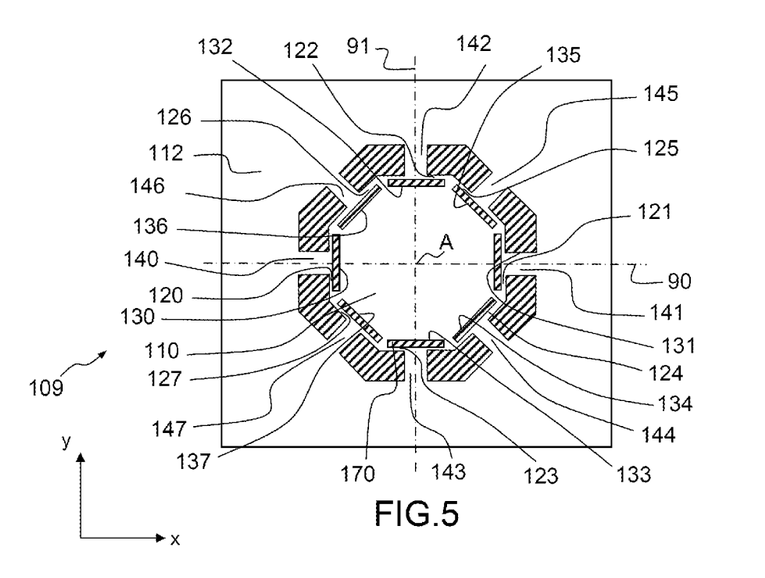
Figure 6:
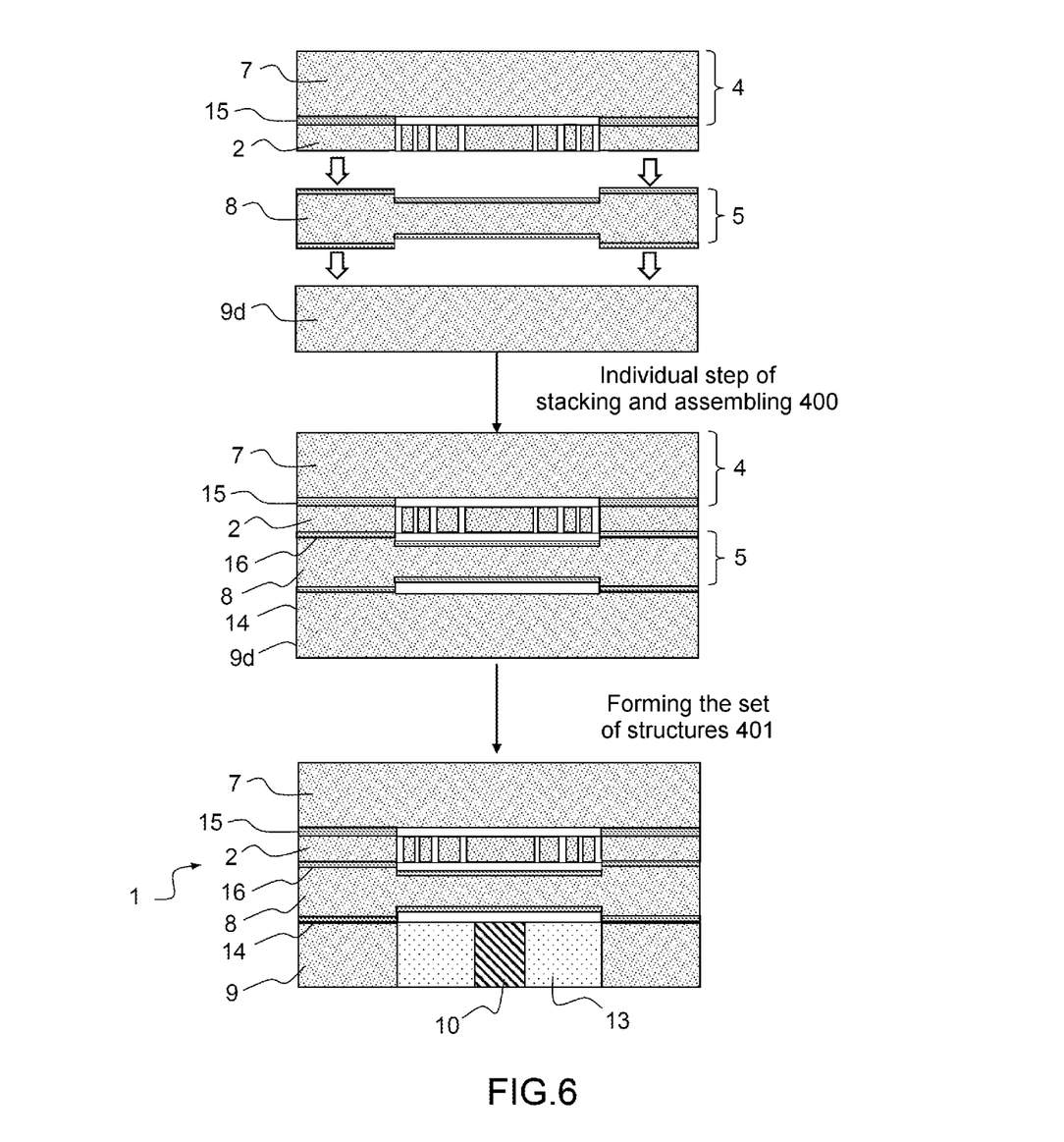
FIG. 6 schematically shows the steps of an exemplary process according to the invention.

FIGS. 4 to 6 show embodiments of the decoupling layer 9 in cross section in the xy plane. The coordinate system Oxyz is orthogonal. In these figures, the silicon has been shown in white and the apertures produced by etching in the silicon have been shown hatched. These embodiments are nonlimiting, other geometries performing the same functions could be envisaged. Moreover, in the embodiments shown, the dimensions (i.e. lengths and widths) of the arms are nonlimiting. These dimensions and the thickness of the silicon layer in which the arms are produced are nonlimiting. The dimensions are chosen specifically for each MEMS sensor so as to obtain the desired compromise between static decoupling and dynamic decoupling.

The decoupling structure 13 and the central attaching element 10 are formed by micro-machining in the thickness of the decoupling layer.

The geometry and arrangement of the decoupling structures relative to the frame 12 and to the central attaching element 10 are defined so as to filter static deformations of the attaching surface in all the directions of the plane of the decoupling layer and so that that portion of the MEMS chip which is connected to the attaching element 10, which is fastened to the carrier 11, via the decoupling structure 23, has vibrational modes of frequencies higher than the frequencies of the useful modes of the active structure 3 in the directions Ox and Oy and about the axis Oz and preferably in all the directions of space in translation and rotation. In other words, the decoupling structure 13 is defined so as to decouple static and dynamic deformations. In other words, when the MEMS chip is fastened to its carrier, exterior stresses and external deformations are not transmitted to those portions of the MEMS chip which are separated from the central attaching element 10 by the decoupling structures 13. Nevertheless, the MEMS chip is rigidly fastened to the carrier.

Because of the dynamic decoupling, the frequencies of the vibrational eigenmodes of the MEMS chip fastened to its carrier are indeed separated from the frequencies of the useful modes of the sensitive element. If this separation is not large enough, coupling may occur between vibrational modes, which greatly degrades the quality factor of the useful mode and therefore the performance of the sensor. Moreover, the vibrational eigenmodes of the MEMS chip fastened to its carrier are not very sensitive to the presence of vibrations in the operating environment, allowing the performance, especially in terms of noise on the output of the sensor, to be controlled.

In the embodiment in FIG. 4, the decoupling structure 9 joining the central attaching element 10 and the frame 12 here comprises two first decoupling elements 20, 21 having a low stiffness in a first direction that is the direction defined by the axis Ox in FIG. 3. The first direction Ox is a direction in the plane Oxy of the decoupling layer. The two first decoupling elements 20, 21 have a high stiffness in a second direction perpendicular to the first direction Ox in the xy plane, i.e. in a direction defined by the axis Oy in FIG. 1. The first direction defined by the axis Ox is the set of straight lines parallel to the axis Ox and the second direction defined by the axis Oy is the set of straight lines parallel to the axis Oy. In other words, the first decoupling elements 20,21 are designed to permit a movement of the central attaching element 10 with respect to the frame 12 in the first direction Ox but to prevent any significant movement of the central attaching element 10 with respect to the frame 12 in the second direction Oy.

These first decoupling elements are preferably located on either side of the central attaching element 10 in the first direction Ox. In other words a first decoupling element 20 is located on one side of the central attaching element and the other first decoupling element 21 is located on the other side of the central attaching element in the first direction Ox. This makes it possible to obtain a good degree of symmetry, this being particularly advantageous if the MEMS functions with differential structures since this makes it possible to preserve their properties.

There are thus two anchoring zones on the frame 12, which zones are located on either side of the movable attachment in the first direction Ox. The two first decoupling elements 20, 21 are preferably located on either side of an axis of symmetry 91, in the xy plane, of the central attaching element 10, parallel to the second direction Oy.

The decoupling structure furthermore comprises two second decoupling elements 22, 23 having a low stiffness in a third direction of the xy plane and a high stiffness in a fourth direction perpendicular to the third direction in the xy plane. In the embodiment in FIG. 4, the third direction is the direction defined by the axis Oy and the fourth direction is the direction defined by the axis Ox. In other words, the decoupling elements are designed to permit a movement of the central attaching element 10 with respect to the frame in the third direction Oy but to prevent any significant movement of the central attaching element 10 with respect to the frame 12 in the fourth direction Ox. Advantageously, the stiffnesses of the first decoupling elements in the respective directions are identical.

The second decoupling elements 22, 23 are preferably located on either side of the central attaching element 10 in the third direction Oy. There are thus two anchoring zones on the frame 12, which zones are located on either side of the movable attaching element in the third direction Oy. Advantageously, the second decoupling elements 22, 23 are preferably located on either side of an axis of symmetry 90, in the xy plane, of the central attaching element 10, parallel to Oy. There are thus two anchoring zones on the frame 12, which are located on either side of the movable attaching element, and which are symmetric with respect to this axis of symmetry 90. Advantageously, the stiffnesses of the second decoupling elements in the respective directions are identical.

The decoupling elements 20 to 23 absorb deformations of the attaching surface 10a of the attaching element 10 in the xy plane, which deformations mainly lead to deformations of the decoupling elements 20 to 23 in the directions Ox and Oy; however, because of their respective stiffnesses, the decoupling elements block relative movements between the attaching element 10 and the frame 12. Thus, the flexibility of the decoupling elements 20 to 23 allows the force transmitted to the active structure 3 for a given static deformation of the central attaching element 10 to be minimized. Nevertheless, combining decoupling elements that are stiff and flexible in different directions allows the MEMS chip to be fastened very stiffly to its carrier. Thus, the vibrational eigenmodes of the MEMS chip (i.e. of that zone of the MEMS chip which is connected to the attaching structure 10 via the decoupling structure 13) in the xy plane have high frequencies, i.e. clearly higher than the frequencies of the useful modes of the active structure. This makes it possible to prevent coupling of the vibrational mode of the MEMS chip fastened to the carrier and the vibrational mode of the active structure, which would greatly degrade the quality factor of the useful mode and therefore the performance of the sensor. These two modes are decoupled when their respective frequencies are different.

In the embodiment in FIG. 4, the first decoupling elements 20, 21 are flexure arms. The first flexure arms 20, 21 are arms that are elongate in the direction defined by the axis Oy (Oy direction), so as to have a high stiffness (high resistance to elongation) in this direction. These arms are more precisely elongate along separate respective axes parallel to the axis Oy. They are very narrow, comparatively to their length, in order to have a low stiffness in the direction defined by the axis Ox (Ox direction), perpendicular to the direction Oy. The second decoupling elements 22, 23 are flexure arms. The second flexure arms 22, 23 arms are arms that are elongate in the direction Ox, so as to have a high stiffness (high resistance to elongation) in this direction. They are very narrow, comparatively to their length, in order to have a low stiffness in the direction Oy, perpendicular to Ox. This configuration is compact, simple to produce and to regulate. As a variant, the decoupling elements may be any other shape having a high stiffness in one direction and a comparatively low stiffness in a direction perpendicular to said direction.

It is possible to envisage a different, higher or lower, number of decoupling element. Generally, the decoupling structure comprises at least one first decoupling element having a low stiffness in a first direction of the xy plane and a high stiffness in a second direction of the xy plane perpendicular to the first direction and a second decoupling element having a low stiffness in a third direction of the xy plane and a high stiffness in a fourth direction of the xy plane, the first and third directions being different. This makes it possible to ensure a fastening that is translationally rigid in the xy plane and rotationally stiff about the z axis.

Advantageously, as is shown in FIG. 4, the first and third directions are orthogonal. This embodiment allows the movement of the suspended portion of the MEMS chip in the presence of vibrations or accelerations applied to the attaching element 10 to be limited.

In FIG. 4, the central attaching element has a square shape with two axes of symmetry 90, 91 in the xy plane. It is joined to the decoupling elements 20, 21, 22, 23 by means of respective rigid arms 40 to 43, i.e. arms having a high stiffness in the directions Ox and Oy.

A second exemplary decoupling layer is shown in cross section in FIG. 5. In this example, the decoupling layer 109 differs from the decoupling layer in FIG. 4 in that it comprises an attaching element 110 bounded by an octagon 170. This octagon 170 has four axes of symmetry. The attaching element 110 is joined to the frame 112 via decoupling elements 120 to 127, which join the respective sides 130 to 137 of the octagon to the frame 112 and take the form of elongate flexure arms respectively extending parallel to the respective sides 130 to 137 of the octagon. The decoupling elements 120 to 127 are joined to the attaching element 110 via respective rigid arms. The larger number of axes of symmetry in the xy plane allows the isotropy of the static stresses transmitted from the carrier to the MEMS chip to be improved.

Generally, the central attaching element 10 is advantageously bounded by an overall polygonal shape. Advantageously, the decoupling structure comprises a plurality of joining elements 120 to 127 and 140 to 147, each joining element comprising at least one of said joining arms 120 to 127 extending parallel to said side 130 to 137 of the polygon. This configuration is particularly advantageous because it is not very bulky.

Advantageously, the polygon is a polygon with N sides and the decoupling structure comprises N joining elements comprising a first set of N flexure arms extending longitudinally parallel to the N respective sides of the polygon. Advantageously, the polygon is regular and has an even number of sides—it is for example a square. Advantageously, the polygon has more than four sides.

In the embodiment in FIG. 4 the arms are located in the interior of the polygon (square), and in the embodiment in FIG. 5 the arms are located on the exterior of the polygon. In one variant (not shown) the decoupling structure comprises two sets of arms located in the interior and on the exterior of the polygon, respectively.

Advantageously, the decoupling elements are designed so as not to allow the frame 10 to move significantly with respect to the attaching element 9 along the z axis. This is achieved by using decoupling elements of sufficient thickness along the z axis. This stiffness makes it possible to stop the frame 10 from moving, with respect to the attaching element 9, rotationally about the axes x and y and translationally along the z axis.

The embodiments in FIGS. 4 and 5 are nonlimiting, the configuration of the decoupling structure is chosen depending on the structure of the sensitive structure and on the desired performance in terms of decoupling.

The number, the geometry and the orientation of the decoupling elements are preferably chosen depending on the symmetry of the decoupling structure. Advantageously, if the active structure has a (or more than one) symmetry element(s) in the plane perpendicular to the stacking direction, the decoupling structure has the same symmetry element(s) as the active structure. Advantageously, the attaching element also has the same symmetry element(s). This makes it possible to prevent there being any anisotropy in the physical effects transmitted to the sensitive element and to minimize the excitation of fastening modes having a rotational movement component in the plane perpendicular to the stacking direction.

Advantageously, the active structure has at least two planes of symmetry that are perpendicular to each other and parallel to the stacking direction Oz, and the fastening structure is configured and arranged so as to be symmetric with respect to these two planes of symmetry. This configuration allows the general symmetry of the structure of the MEMS chip to be preserved, which makes it possible to ensure the symmetry of the physical effects exerted on the sensitive structure. This is particularly important in the case where the sensitive structure is produced with a differential structure, as is frequently the case in the highest performance MEMS sensors.

Advantageously, the attaching element and the decoupling structure have planes of symmetry parallel to the stacking direction, these planes of symmetry intersect along a straight line that is parallel to the stacking direction and on which the centre of gravity of that portion of the MEMS chips which is connected to the attaching element via the decoupling structure is located. This portion of the MEMS chip is formed by the frame, the first and second covers and the active layer. In other words, the coordinates of the centre of gravity of that portion of the MEMS chip which is connected to the attaching element via the decoupling structure in a plane perpendicular to the stacking direction are the same as those of the straight line on which the planes of symmetry of the decoupling structure intersect. These coordinates are the coordinates of the point A in the example in FIG. 4. This configuration allows the structure to be balanced, so as to limit the effect of vibrations. It makes it possible to prevent that portion of the MEMS chip which is connected to the attaching element via the decoupling structure from pivoting with respect to the decoupling structure about the axes ox and oy.

The invention also relates to a process for fabricating a microelectromechanical system according to the invention.

The process comprises a step of forming the assembly of the plurality of layers, comprising a step of forming layers, which step is divided into substeps relating to the various layers; and a step of stacking and assembling the various layers, which step is optionally divided into individual steps of stacking and assembling a plurality of layers selected from the layers intended to form the stack.

According to the invention, the stacking and assembling process step comprises an individual step of stacking and assembling the decoupling layer 9 and the silicon layer 8 of the second protective cover 5, so that at most one film 14 of a material is interposed between the decoupling layer 9 and said silicon layer 8, the material being silicon dioxide.

Advantageously, as was specified above, the individual step of stacking and assembling the decoupling layer 9 and the silicon layer 8 of the second protective cover 5 is a direct bonding step. As a variant, this step is a step of an anodic bonding.

An exemplary fabricating process according to the invention is shown in FIG. 6.

The active structures and the sets of structures are obtained by micro-machining.

The active structure may be machined using as starting substrate a silicon-on-insulator substrate, but other methods are also possible. A silicon-on-insulator substrate consists of a silicon substrate of a few hundred microns thickness that bears on its front side a thin silicon-oxide layer itself covered with a single-crystal silicon layer of a few tens of microns thickness. The machining consists in etching the silicon of the top layer from its front side, to the desired surface patterns, by means of mask-transfer techniques commonly used in microelectronics, until the oxide layer is reached, with a selective etching product that etches the silicon without significantly etching the oxide. The etching is stopped once the oxide layer has been exposed. This oxide layer is then removed by selective etching with another product so as to preserve only the surface single-crystal silicon layer, except in the locations of the anchoring zones, in which zones the oxide layer remains and forms a secure joint between the substrate and the surface single-crystal silicon layer (the active layer). This machining from the front side defines the various shapes of the movable portions.

A wafer called the active wafer structure, which consists of an assembly of the first cover and the active layer, is obtained.

In the embodiment in FIG. 6, the process comprises:

an individual step 400 of stacking and assembling the obtained active wafer structure 4, 15, 2, the second cover 5 and a single-crystal silicon layer 9d, which is intended to form the decoupling layer, the assembly preferably being achieved by direct bonding, since this step is the step of assembling the decoupling layer and the silicon layer of the second cover, followed by a step 401 of forming the set of structures in the silicon layer 9d intended to form the decoupling layer so as to obtain the decoupling layer.

The step 401 of forming the set of structures is therefore subsequent to the individual step 400 of stacking and assembling the decoupling layer and the silicon layer of the second cover. As a variant, the step of forming the set of structures could be prior to the step of assembling the decoupling layer and the silicon layer of the second cover.

In the nonlimiting embodiment in FIG. 6, the silicon layer of the second cover is oxidized prior to the step of assembly with the layer 9d.

The step of forming the set of structures is also a machining step such as described with regard to the production of the active layer. Preferably, the step of forming the decoupling structure comprises a deep reactive ion etching (DRIE) step. This type of etching is preferred for its precision and for the good verticality of the sidewalls of the apertures, but a chemical wet etching technique (e.g. etching with potassium hydroxide, KOH) may also be envisaged. The optional silicon-oxide layer separating the second cover and the silicon layer intended to form the decoupling structure or mechanical decoupler serves as stop layer for the etching.

In one variant (not shown) the process comprises:
a step of forming the active structure in a first silicon-on-insulator substrate,
an individual step of stacking and assembling the active wafer structure obtained in the preceding step and a second silicon-on-insulator substrate facing the active layer, the second silicon-on-insulator substrate comprising a first silicon layer facing the active layer and a second silicon layer intended to form the decoupling layer, the assembly is advantageously achieved by direct bonding,
followed by a step of forming the set of structures in the silicon layer intended to form the decoupling layer.

In another variant (not shown), the set of structures is produced in a double silicon-on-insulator substrate comprising a stack of a silicon-substrate layer intended to form the decoupling layer and two other silicon layers, one intended to form the silicon layer of the second cover and the other intended to form the active layer. This step is followed by a step of stacking the obtained double silicon-on-insulator substrate with the first cover and of assembly by direct bonding. The individual step of assembling the decoupling layer and the silicon layer of the second protective cover is carried out during the manufacture of the double silicon-on-insulator substrate.

The embodiments described above are nonlimiting exemplary embodiments.

Advantageously, the step of forming the assembly of the plurality of layers is a wafer-scale step. It allows an assembly taking the form of a wafer integrating a plurality of microelectromechanical systems according to the invention to be obtained, the respective layers of which are common to all the microelectromechanical systems. The layers comprise an active layer comprising a plurality of active structures, a first cover layer comprising a plurality of first covers, a second cover layer comprising a plurality of second covers and a decoupling layer comprising a plurality of sets of structures. In other words, the individual stacking and assembly steps are common to all the microsystems.

The fabricating process comprises a separating step consisting in dicing the wafer so as to singulate the microsystems according to the invention, i.e. to separate them from one another.

The process for fabricating the electromechanical device according to the invention comprises the process described above and a step of attaching the MEMS chip, i.e. the microelectromechanical system, to the carrier so that the MEMS chip is fastened to the carrier via the central attaching element. In other words, only the attaching element of the decoupling layer is fastened to the carrier. This step may be carried out by soldering or adhesive bonding or by any other fastening means. This step is carried out individually for each MEMS chip, i.e. after the separating step.

The invention claimed is:

1. A microelectromechanical system comprising an assembly of a plurality of layers stacked in a stacking direction comprising:
 an active layer made of single-crystal silicon, said active layer comprising an active structure, and
 a first cover and a second cover defining a cavity around the active structure, the active layer being interposed between the first cover and the second cover, the second cover comprising a single layer made of single-crystal silicon,
 wherein the assembly further comprises a decoupling layer made of single-crystal silicon and comprising:
  an attaching element intended to be fastened to a carrier,
  a frame encircling the attaching element in the plane of the decoupling layer, and
  a mechanical decoupling structure connecting the frame and the attaching element, the mechanical decoupling structure allowing the attaching element to be flexibly joined to the frame,
 wherein the frame is secured to the silicon layer of the second cover and wherein at most one film of a material is interposed between said frame and said silicon layer of the second cover, the material being silicon dioxide.

2. The microelectromechanical system according to claim 1, wherein the decoupling layer and the second cover are assembled by direct bonding.

3. The microelectromechanical system according to claim 1, wherein the shape of the active structure in a plane perpendicular to the stacking direction has at least one symmetry element and wherein the mechanical decoupling structure has said at least one symmetry element.

4. The microelectromechanical system according to claim 1, wherein the attaching element and the decoupling structure have planes of symmetry parallel to the stacking direction, these planes of symmetry intersecting along a straight line that is parallel to the stacking direction and on which is located the centre of gravity of that portion of the microelectromechanical system which is connected to the attaching element by the decoupling structure.

5. The microelectromechanical system according to claim 1, wherein the mechanical decoupling structure comprises:
 at least one first decoupling element designed to permit a movement of the attaching element with respect to the frame in a first direction of the plane of the decoupling layer but to prevent any significant movement of the attaching element with respect to the frame in a second direction of the plane of the decoupling layer perpendicular to the first direction, and
 at least one second decoupling element designed to permit a movement of the attaching element with respect to the frame in a third direction of the plane of the decoupling layer but to prevent any significant movement of the attaching element with respect to the frame in a fourth direction of the plane of the decoupling layer perpendicular to the third direction, the third direction being distinct from the first direction.

6. The microelectromechanical system according to claim 5, wherein the first direction and the third direction are orthogonal.

7. The microelectromechanical system according to claim 6, wherein the mechanical decoupling structure comprises two first decoupling elements, which are placed on either side of the attaching element in the first direction, and two second decoupling elements, which are placed on either side of the attaching element in the third direction.

8. The microelectromechanical system according to claim 5, wherein the first and second decoupling elements are flexure arms.

9. The microelectromechanical system according to claim 8, wherein the central attaching element is bounded by a polygon having a plurality of sides, the decoupling structure comprising joining elements joining the frame and the respective sides of the polygon, each joining element comprising at least one of said joining arms extending parallel to said side of the polygon.

10. The microelectromechanical system according to claim 9, wherein the polygon has more than four sides.

11. An electromechanical device comprising the microelectromechanical system according to claim 1 and a carrier, the decoupling layer being fastened to said carrier only via said attaching element.

12. The electromechanical device according to claim 11, wherein a single continuous surface of the attaching element is fastened to said carrier.

13. A process for fabricating a microelectromechanical system according to claim 1,
said process comprising a step of forming the assembly comprising a stacking and assembling step in which the decoupling layer and the silicon layer of the second cover are stacked and assembled so that at most one film of a material is interposed between the decoupling layer and said silicon layer of the second cover, the material being silicon dioxide.

14. The fabricating process according to claim 13, wherein the decoupling layer and the silicon layer of the second cover are assembled by direct bonding.

15. The fabricating process according to claim 13, comprising a step of forming the assembly of the plurality of layers on the wafer scale, allowing an assembly taking the form of a wafer integrating a plurality of microelectromechanical systems to be obtained, and a separating step consisting in dicing the wafer so as to singulate the microelectromechanical systems.

* * * * *